(12) United States Patent
Knoll et al.

(10) Patent No.: US 7,265,637 B2
(45) Date of Patent: *Sep. 4, 2007

(54) STARTUP/YANK CIRCUIT FOR SELF-BIASED PHASE-LOCKED LOOPS

(75) Inventors: Ernest Knoll, Haifa (IL); Eyal Fayneh, Givatayim (IL)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/476,690

(22) Filed: Jun. 29, 2006

(65) Prior Publication Data

US 2006/0244542 A1 Nov. 2, 2006

Related U.S. Application Data

(62) Division of application No. 11/122,064, filed on May 5, 2005, now Pat. No. 7,095,289, which is a division of application No. 10/446,838, filed on May 29, 2003, now Pat. No. 6,922,047.

(51) Int. Cl.
*H03L 7/00* (2006.01)
(52) U.S. Cl. .................................. 331/17; 331/10
(58) Field of Classification Search ............... 331/17, 331/16, 10
See application file for complete search history.

(56) References Cited

U.S. PATENT DOCUMENTS

| | | | |
|---|---|---|---|
| 5,304,955 A | 4/1994 | Atriss et al. ............... 331/1 R |
| 5,512,860 A | 4/1996 | Huscroft et al. ............ 331/1 A |
| 5,696,468 A * | 12/1997 | Nise ............................. 331/14 |
| 6,078,634 A | 6/2000 | Bosshart ....................... 375/376 |
| 6,147,561 A | 11/2000 | Rhee et al. .................... 331/12 |
| 6,326,826 B1 * | 12/2001 | Lee et al. .................... 327/161 |
| 6,329,882 B1 | 12/2001 | Fayneh et al. ................ 331/10 |
| 6,466,058 B1 * | 10/2002 | Goldman ..................... 327/49 |
| 6,476,681 B1 | 11/2002 | Kirkpatrick .................. 331/17 |
| 6,693,494 B2 | 2/2004 | Fan .............................. 331/17 |
| 6,762,649 B2 | 7/2004 | Miller .......................... 331/17 |
| 6,922,047 B2 * | 7/2005 | Knoll et al. ............. 324/76.53 |
| 7,038,508 B2 * | 5/2006 | Parker et al. ............... 327/156 |
| 2001/0017572 A1 * | 8/2001 | Harpham ..................... 331/14 |
| 2003/0227332 A1 | 12/2003 | Lee et al. ..................... 331/17 |

* cited by examiner

*Primary Examiner*—Joseph Chang
(74) *Attorney, Agent, or Firm*—Ked & Associates, LLP

(57) ABSTRACT

An apparatus for controlling a phase-locked loop includes a detector for detecting at least one of a startup condition and a yank condition and a controller for controlling current between a charge pump and the phase-locked loop. If a startup condition is detected, the controller sinks current from a control node connected to a loop filter of the phase-locked loop. This, in turn, causes a bias voltage to increase until the phase-locked loop transitions from startup mode to a normal acquisition mode. The current sink is provided by a dummy charge pump and the startup condition is determined by detecting the end of a PLL disable state. If a yank condition is detected, a charge pump connected to a phase-frequency detector of the phase-locked loop controls the bias voltage until a feedback frequency becomes lower than a reference frequency. Methods for controlling a phase-locked loop during both modes of operation may use of the aforementioned apparatus.

23 Claims, 7 Drawing Sheets

STARTUP/YANK CIRCUIT FOR SELF-BIASED PHASE-LOCKED LOOPS

CROSS-REFERENCE TO RELATED APPLICATIONS

This application is a divisional of U.S. patent application Ser. No. 11/122,064, filed on May 5, 2005, now U.S. Pat. No. 7,095,289 which is a divisional of U.S. patent application Ser. No. 10/446,838, filed on May 29, 2003, now U.S. Pat. No. 6,922,047.

BACKGROUND OF THE INVENTION

1. Field of the Invention

This invention relates to generating control signals, and more particularly to a system and method for controlling the operation of an oscillation circuit such as a phase-locked loop.

2. Description of the Related Art

Phase-locked loop (PLL) circuits are desirable because of their ability to produce a stable output frequency. They are commonly used, for example, to generate mixing signals in communications systems, clock signals for controlling the speed and synchronizing the operation of microprocessor systems, and timing signals for transferring data in various data storage applications.

Next-generation communications systems and processing architectures will inevitably run at faster speeds than are currently attainable. This will require a commensurate increase in the frequency of their driving clock signals. At very high frequencies, a type of phase error known as jitter has a more severe affect on system performance. Even at current frequencies, however, jitter will have a major adverse effect on the operating frequency of microprocessor systems as well as the bit-error rate. It is further noted that the negative jitter effect is higher at higher frequencies.

A principal source of jitter in a phase-locked loop circuit is leakage current in sensitive nodes, like the steering node of a voltage-controlled oscillator. In conventional self-biased phase-locked loops, transistors including those in startup circuits are a major contributor to this effect. Conventional startup circuits are also slow (taking anywhere from 0.5 to 1.5 µs to respond) which further impairs the performance of the self-biased PLL.

Recently, efforts have been made to improve PLL performance by increasing the speed of the startup circuit. Designers have discovered, however, that a significant tradeoff exists between the speed of the startup circuit and leakage. For example, conventional approaches attempt to increase the speed of PLL startup circuits by using larger transistors. Unfortunately, larger transistors produce greater leakage, which results in a proportional increase in the amount of jitter in the self-biased PLL.

DESCRIPTION OF THE PREFERRED EMBODIMENTS

Figure 1:
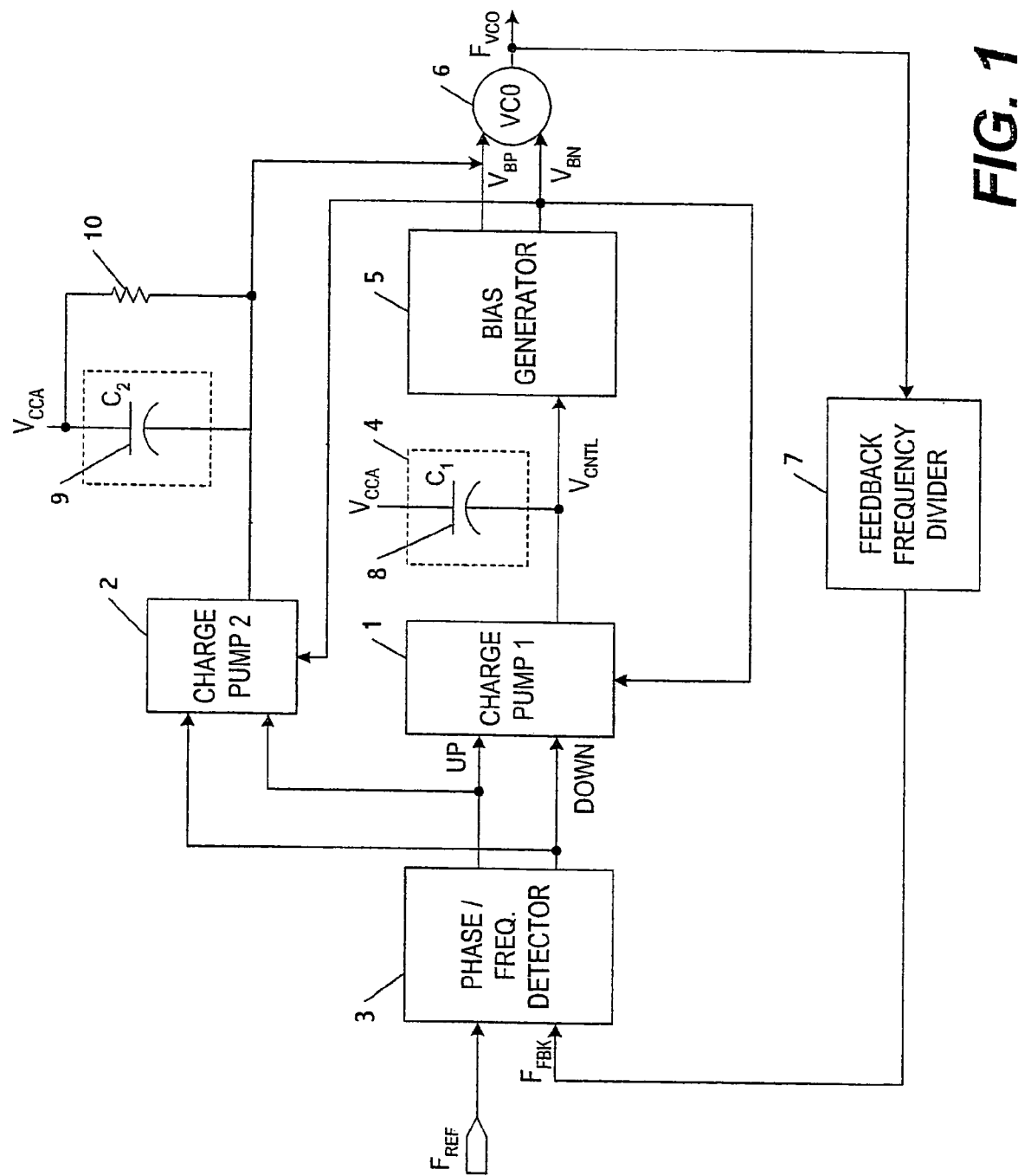
FIG. 1 is a diagram showing a self-biased phase-locked loop circuit.

FIG. 1 shows a self-biased phase-locked loop circuit in accordance with one embodiment of the present invention. This circuit includes first and second charge pumps 1 and 2 connected to the output of a phase-frequency detector 3, a loop filter 4 connected to the first charge pump, a bias generator 5 connected to the loop filter, and a voltage-controlled oscillator 6. The bias generator generates an nbias voltage $V_{BN}$ based on a control voltage $V_{cntl}$ output from the first charge pump. The nbias voltage $V_{BN}$ sets a bias of the voltage-controlled oscillator and charge pumps in order to bias the circuit based on a predetermined current value. In addition to these features, a divider 7 may be included along a feedback path. The divider may be, for example, a 1/N programmable divider.

The phase-frequency detector compares a reference frequency $F_{ref}$ with a feedback signal $F_{fbk}$ and outputs one of an Up signal and a Down signal based on the comparison. If the reference frequency leads the feedback frequency, an Up signal pulse may be applied to the charge pumps. Conversely, if the reference frequency lags the feedback frequency, a Down signal pulse may be applied. Those skilled in the art can appreciate that the signals may be reversed depending upon whether the voltage-controlled oscillator has positive or negative gain. Also, the width of the Up pulse or Down pulse (whichever is applied) is proportional to the phase difference between $F_{ref}$ and $F_{fbk}$.

The output of charge pump 1 is input into a capacitor 8 of the loop filter and the bias generator. The loop filter capacitor performs at least two functions. First, this capacitor integrates the current signal output from the first charge pump to produce a smooth control voltage (e.g., $V_{cntl}$) for the bias generator. The bias generator converts this voltage into a signal nbias $V_{BN}$ which is fed back to the charge pumps and input into the voltage-controlled oscillator to set the PLL circuit to a desired bias. Such a bias may be set in accordance with any one of a variety of known techniques. Second, the loop filter capacitor functions as a low-pass filter for suppressing high-frequency noise. This filtering function is desirable because it provides stability to the operation of the PLL circuit.

The output of charge pump 2 is input into a second capacitor 9 and a resistor 10. The resistor may be implemented by transistors and its value dynamically adjusted based on the nbias voltage. Connecting the second capacitor in parallel with the resistor is advantageous because it smooths the voltage over the resistor at the steering line of the VCO.

The second capacitor also prevents the control voltage for the voltage-controlled oscillator from changing too rapidly, by integrating the current pulses output from the second charge pump. The amplitude of the resultant voltage pulse at the VCO steering line is substantially reduced. As a result, the second charge pump becomes stable over time and output jitter performance is significantly enhanced. Also, it is noted that adding the second capacitor to the PLL changes the circuit from a second-order to a third-order phase-locked loop. The output of the bias generator $V_{BN}$ is coupled with the $V_{BP}$ output from the second charge pump, once having passed capacitor 9 and resistor 10, to control the VCO frequency in a manner that reduces or eliminates the differences between the reference and feedback frequencies input into the phase-and frequency detector.

Phase-locked loops of the aforementioned type may be initialized using a startup circuit. Such a circuit is preferable because of the self-biased nature of the PLL, which may be explained as follows. At power on, the bias voltages are zero, e.g., $V_{BN}=0$ and $V_{cntl}=V_{CCA}$. Under these conditions, the charge pump currents are zero and the voltage-controlled oscillator is not biased, i.e., not oscillating. Consequently, the phase-locked loop is not functional.

To place the PLL in a functional state (i.e., one that will allow phase lock to take place, otherwise know as normal acquisition mode), a startup circuit may be included. This circuit provides enough bias to the charge pumps and voltage-controlled oscillator to allow lock to occur, i.e., generate VCO oscillations and charge pump currents sufficient to ensure that phase/frequency correction can take place. This bias condition may require, for example, that $V_{BN}$ be higher than the threshold voltage of the NMOS transistor and the voltage difference ($V_{CCA}-V_{cntl}$) be greater than the threshold voltage of the PMOS transistors. Also, in normal operation $V_{cntl}$ may equal $V_{BP}$ in average (or as a DC value). Startup is one of many modes of operation of the self-biased PLL. Other modes include a main operational mode where the PLL locks onto and tracks reference-signal phase changes, as well as yank and PLL disable modes both of which are discussed in greater detail below.

Figure 2:
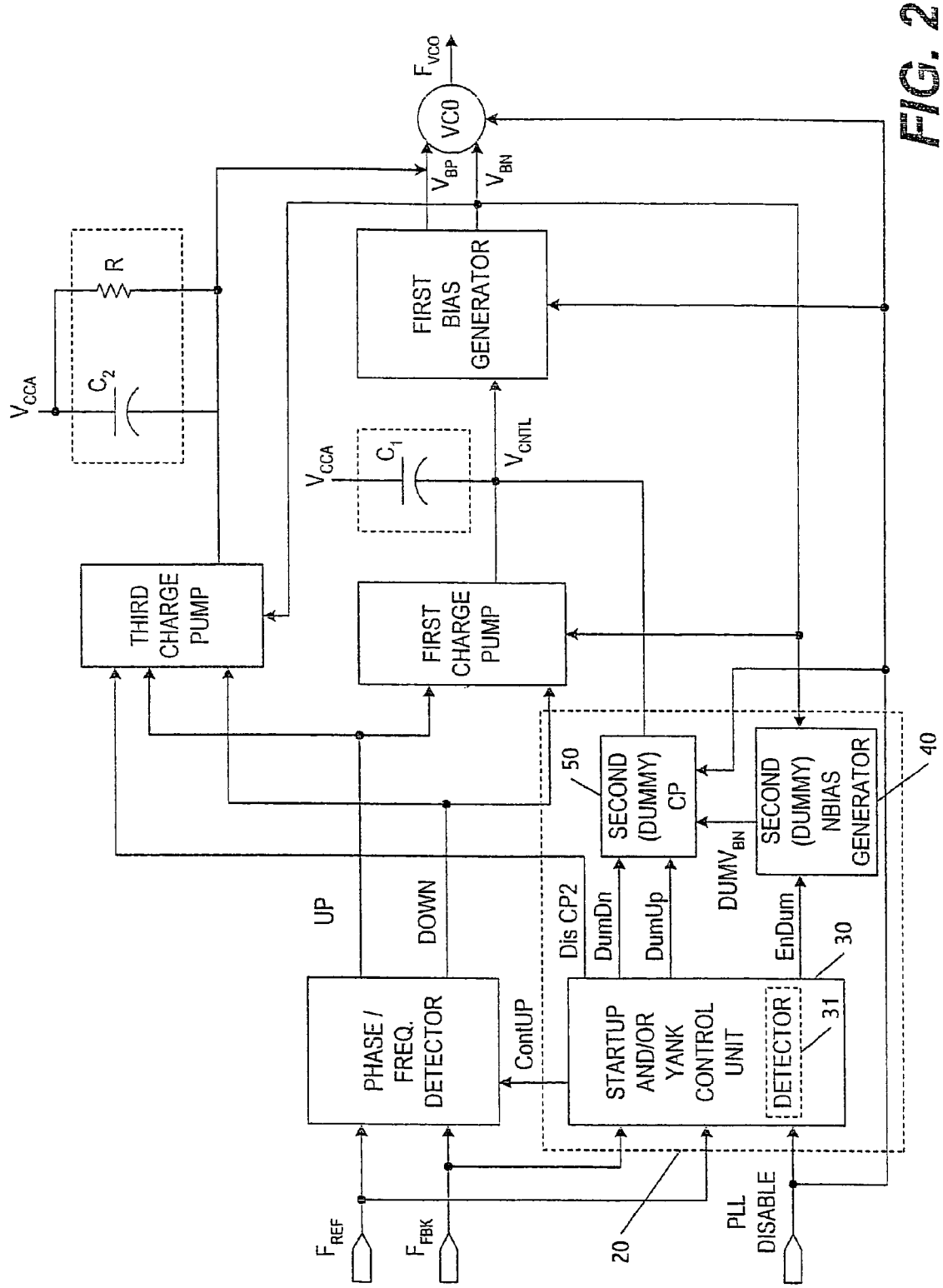
FIG. 2 is a diagram showing a controller for performing startup and yank operations in a self-biased phase-locked loop circuit in accordance with one embodiment of the present invention.

FIG. 2 shows a controller 20 which controls the operation of a self-biased phase-locked loop such as shown in FIG. 1. (In these figures, like reference numerals have been used where applicable.) In accordance with one embodiment of the present invention, the controller monitors the operational state of the phase-locked loop to detect at least one of a plurality of conditions and then takes actions to adjust the loop so that it conforms to a desired mode of operation. These conditions include but are not limited to a startup condition and a yank condition. When either condition is detected, the controller generates signals to place the PLL in a mode where adequate frequency lock can take place, otherwise referred to as normal acquisition mode. The manner in which these signals are generated is described below, but first a discussion of the structural features of the controller will be given.

The controller includes a control unit 30, a second (dummy) nbias generator unit 40, and a second (dummy) charge pump 50. The control unit detects at least one of a plurality of operational states of the PLL and then generates one or more of the following control signals: DisCP2, DumDn, DumUp, EnDum, and ContUP. The DisCP2 signal disables a third charge pump. The DumDn and DumUp signals controls the dummy charge pump to charge or pump current from capacitor $C_1$, thus modifying the voltage level at the $V_{cntl}$ node connecting the loop filter 4 and bias generator 5. More specifically, DumUp increases the voltage level at $V_{cntl}$ and DumDn decreases the voltage level at $V_{cntl}$. The EnDum signal enables the dummy nbias unit. And, the ContUP signal controls the phase/frequency detector 1 so that it outputs only a desired one of its Up or Down signals. In order to perform these functions, the control unit may include a detection unit 31 and a logic circuit. The logic circuit may be implemented, for example, as a combination of logic gates and the detection circuit by one or more flip-flops. Moreover, the control unit may be automatically triggered to control operation of the self-biased PLL when a specific operational state is detected.

Figure 3:
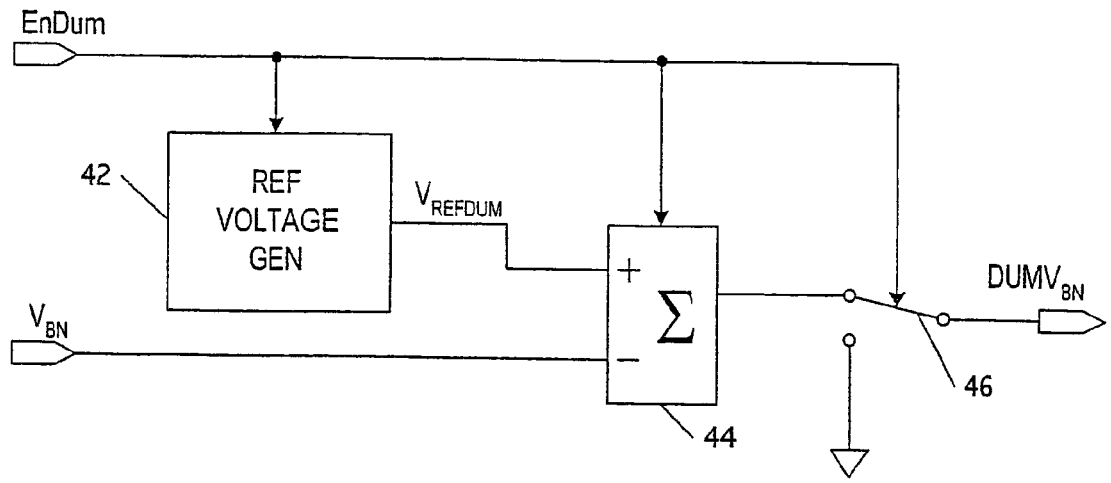
FIG. 3 is a diagram showing how the dummy nbias unit may be constructed in accordance with one embodiment of the present invention.

FIG. 3 shows one way in which the dummy nbias unit of FIG. 2 may be constructed. This unit includes a reference voltage generator 42 connected to a summing amplifier 44. If the control unit detects a state requires the Dummy Nbias to be active, then the EnDum control signal is asserted. More specifically, when the control unit outputs a control signal EnDum, the reference voltage generator and summing amplifier are activated and a switch 46 connects the output of the summing amplifier from a reference potential terminal to the output of the summing amplifier. The summing amplifier then determines the difference between the bias voltage $V_{BN}$ output from the bias generator (FIG. 2) and reference value $V_{RefDum}$. (Also, it is noted that the EnDum signal may also be activated when a yank condition or PLL disable state is detected. These aspects will be discussed in greater detail below.)

During a startup condition, $V_{BN}$ is a small value and therefore the difference between reference value $V_{RefDum}$ and $V_{BN}$ will be a large value. The difference between $V_{RefDum}$ and $V_{BN}$ determines a value of a control signal DUM-$V_{BN}$, which determines the amount of current of the current sources in the dummry charge pump. $V_{RefDum}$ may be a fixed value (e.g., $V_{CCA}/2$) while $V_{BN}$ may be variable during startup/yank. (It is further noted that $V_{BN}$ may vary with process, temperature, $V_{CCA}$, and (if the PLL is locked) with the VCO frequency).

More specifically, the magnitude of control signal DUM-$V_{BN}$ is proportional to the difference between $V_{RefDum}$ and the PLL bias voltage $V_{BN}$. When the PLL bias voltage $V_{BN}$ is small (e.g., corresponding to a startup condition), control signal $DUMV_{BN}$ is large. This determines the current of the Dummy CP to be large, which, in turn, has the effect of quickly modifying the voltage level at $V_{cntl}$ (FIG. 2). While the $V_{cntl}$ level decreases, the bias voltage $V_{BN}$ increases which produces two effects. First, the current in the first charge pump 1 increases, so the first charge pump can also affect the voltage level at $V_{cntl}$. Second, the $DumV_{BN}$ voltage decreases, which produces a reduction in the current of the Dummy CP. Because of these effects, during startup mode the weight of the Dummy CP decreases, while the weight of charge pump 1 increases as the PLL approaches the Normal Acquisition mode (e.g., end of startup). In other words, the PLL "gets prepared" for the Normal Acquisition mode using more and more of its own resources (e.g., charge pump 1, $V_{BN}$) and fewer resources from the aiding circuits (e.g., Dummy CP, $DumV_{BN}$). When startup mode ends (e.g., when the PLL enters Normal Acquisition mode), EnDum is de-asserted, $DumV_{BN}$ is connected to a reference potential (e.g., ground) via switch 46, and the dummy charge pump current is at least substantially zero. As a result, the dummy charge pump becomes inactive.

To reiterate, when $V_{BN}$ is large, control signal $DUMV_{BN}$ is small which corresponds to a situation where the PLL is no longer operating in startup mode. Such a condition is detected by the control unit. Operation of the dummy charge pump thus depends at least in part on the value of control signal $DUMV_{BN}$.

Figure 4:
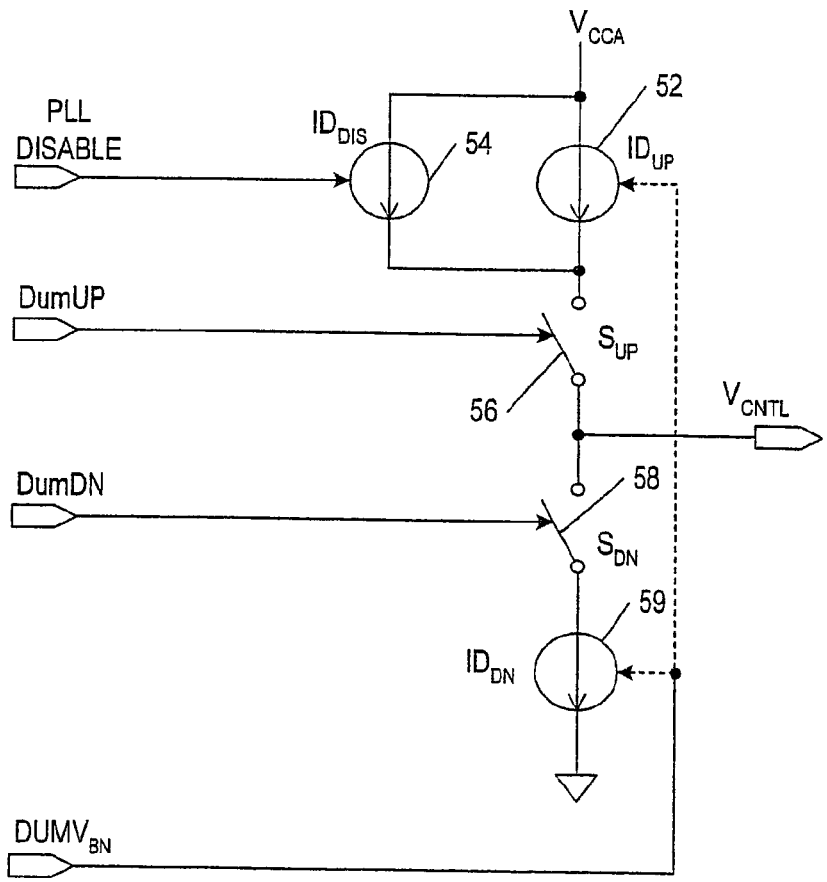
FIG. 4 is a diagram showing an example of how the dummy charge pump may be constructed in accordance with one embodiment of the present invention.

FIG. 4 shows one way in which the dummy charge pump of FIG. 2 may be constructed. This charge pump includes a pump current source ($ID_{up}$) 52, a disable current source ($ID_{dis}$) 54, a switch ($S_{up}$) 56, a switch ($S_{dn}$) 58, and a sink current source ($ID_{dn}$) 59. Switch ($S_{up}$) 56 is controlled by the DumUp signal from the control unit. When DumUp is asserted, switch 56 connects current sources $ID_{up}$ 52, or $ID_{up}$ 52+$ID_{dis}$ 54, to charge current to the node $V_{cntl}$. Switch ($S_{dn}$) 58 connects the sink current source $ID_{dn}$ 59 to pump current from the $V_{cntl}$ node. Using these elements, the dummy charge pump sources current to or sinks current from the $V_{cntl}$ node connected to the loop filter. This results in a proportional increase/decrease of the voltage stored in the loop filter capacitor C1. The nbias voltage $V_{BN}$ output from the bias generator is therefore proportionately affected.

Preferably, voltage $V_{BN}$ varies in inverse proportion to changes at the control node $V_{cntl}$. Thus, when $V_{cntl}$ decreases based on the output of the dummy charge pump, $V_{BN}$ increases. The increase in $V_{BN}$ causes the first charge pump to increase its output current to control node $V_{cntl}$. At the same time, the output current of the dummy charge pump is decreases. This occurs because $DUMV_{BN}$ decreases as a result of the diminishing difference between $V_{BN}$ and $V_{refdum}$. If desired, the output of the first charge pump may vary linearly with changes in the voltage $V_{BN}$ output from the bias generator and the same may be true of the dummy charge pump.

The two current sources of the dummy charge pump are controlled by (e.g., set by) bias voltage $DUMV_{BN}$ output from the dummy nbias unit. The output of the current sources are made to vary in proportion to the magnitude of the $DUMV_{BN}$ signal. This proportional variance may be linear or exponential or may correspond to some other function or mathematical relationship. As an example, consider the case when $DUMV_{BN}$ is large (signifying, for example, the detection of a startup mode by the control unit). Under these circumstances, current sources 52 and 58 are enabled and assume relatively high values. Whether current is pumped to or sinked from control node $V_{cntl}$, depends upon which signal DumUP and DumDN is output from the control unit. If DumDn is output, switch $S_{dn}$ is closed and current source 48 sinks current from the node $V_{cntl}$ connected to the bias generator of the PLL. This results in reducing the voltage stored in the loop filter capacitor C1 and thus decreasing the voltage at node $V_{cntl}$.

Decreasing the voltage at node $V_{cntl}$ causes bias voltage $V_{BN}$ to increase. As a result, bias voltage $DUMV_{BN}$ decreases which, in turn, causes the output of current sources 42 and 48 to decrease proportionally. The voltage at control node $V_{cntl}$ is proportionally affected. When $V_{BN}$ changes enough to alter the operational state of the PLL, the control unit may output a different array of control signals or may be deactivated, depending upon the specific objective to be accomplished. The controller thus operates as a feedback mechanism, which is desirable because it moderates the slope of $V_{cntl}$, and consequently the VCO frequency change rate as the PLL approaches its desired operating frequency range.

Operation of the aforementioned embodiment of the controller of the present invention will now be discussed, with reference to the flow diagrams of FIGS. 5 and 6 which show blocks included in at least one embodiment of a method for controlling a phase-locked loop in accordance with the present invention. In this embodiment, the controller monitors the operational state of the phase-locked loop to detect at least one of a startup condition and a yank condition. When either condition is detected, the controller generates signals to place the PLL in normal acquisition mode wherein adequate frequency lock takes place. The controller also detects the end of startup or yank, and disables the "aid" dummy circuits.

Startup Mode Detection and Correction

At power on, bias voltage $V_{BN}$=0 and the voltage at control node $V_{cntl}$=$V_{CCA}$. Under these conditions, the charge pump currents are zero and the voltage-controlled oscillator is not biased and thus not oscillating. Consequently, the phase-locked loop is not functional. (Incidentally, it is noted that $V_{BN}$=0 and $V_{cntl}$ may be equal to $V_{CCA}$ during a PLL disable state). To place the PLL in normal acquisition mode (i.e., one that will allow phase lock to take place), the following blocks may be performed.

Figure 5:
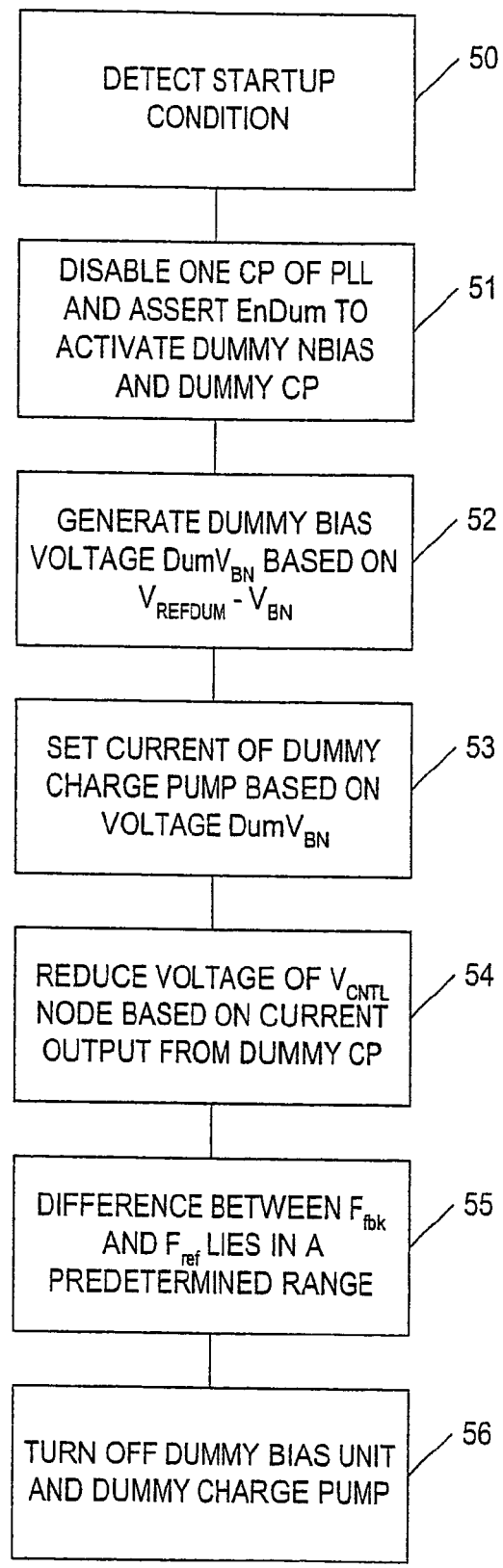
FIG. 5 is a diagram showing blocks included in a method for controlling the startup operation of a phase-locked loop in accordance with one embodiment of the present invention.

Referring to FIG. 5, in a first block, the control unit of the controller detects the startup condition of the PLL circuit. (Block 50). A startup condition may be detected, for example, coincident with the end of a PLL disable state. This PLL disable state may occur, for example, when any of the following exists: when the power supply voltage is not at a nominal value (at power up), when the PLL reference signal is not stable (e.g., the reference signal PLL generator did not lock yet), in any one of a variety of power saving modes, or in different testing modes. (At this point, it is noted that the feedback frequency signal $F_{fbk}$ is proportional to the output frequency of the voltage-controlled oscillator. If no feedback divider exists in the feedback path, the feedback frequency signal may equal the output of the voltage-controlled oscillator, $F_{fbk}$=$F_{vco}$. If a divider is included, $F_{fbk}$ may equal $F_{vco}$ divided by some value N of the divider.)

From FIG. 3, it is clear that at power on (and thus during a startup condition), a value of $V_{BN}$=0 causes the maximum value of $DUMV_{BN}$ to be output from the summing amplifier. This maximum value ensures that the current sources in the dummy charge pump are set to generate high charge and pump currents.

As previously mentioned, a PLL disable state precedes startup and more specifically may be used to prepare the PLL for startup. It may also be used to reduce the current consumption of the main PLL blocks. Thus, when PLL disable is asserted it is prefereable to drive the $V_{cntl}$ line as quickly as possible to $V_{CCA}$. This is why in accordance with at least one embodiment of the present invention both DumUp and PLL disable signals are aserted in PLL disable mode and the current driven to the $V_{cntl}$ node through switch 56 is $ID_{up}$+IDDIS. A more detailed description of the PLL disable state follows.

The following conditions exist during PLL disable state. The EnDum signal enables the reference voltage generator and summing amplifier of the dummy nbias unit to thereby generate a large value of $DUMVB_{BN}$, which is input into the dummy charge pump. The DumUp signal closes switch ($S_{up}$) 46 in the dummy charge pump and current source 54 is activated by the disable signal, thereby charging the capacitor in the loop filter. As a result, node $V_{cntl}$ swings towards the value of supply voltage $V_{CCA}$ (e.g., $V_{cntl}$=$V_{BP}$=$V_{CCA}$). As previously discussed, $V_{BN}$ and $V_{cntl}$ are inversely proportional. Thus, a high value of $V_{cntl}$ drives $V_{BN}$ to a low value, which, for example, may correspond to a reference potential of $V_{SS}$, e.g., ground. As a result, the voltage-controlled oscillator is disabled.

In a second block, the method begins transitioning the phase-locked loop from startup mode to normal acquisition mode. This involves outputting the DisCP2, EnDum, and DumDn signals from the control unit, either simultaneously or serially in any preferred order. The DisCP2 signal disables the third charge pump, which ensures that $V_{bp}=V_{cntl}$. (Block 51). This is advantageous in order to ensure proper operation of the PLL. For example, if $V_{bp}$ does not at least substantially equal $V_{cntl}$, the VCO may experience starvation effects.

The EnDum signal is asserted to activate the Dummy NBIAS and Dummy charge pump circuits. This results in enabling the reference voltage generator and the summing amplifier in the dummy nbias unit. As a result, the summing amplifier determines the difference between the reference voltage $V_{refdum}$ and bias voltage $V_{BN}$. After the PLL disable mode, bias voltage $V_{BN}$ is ensured of being low (e.g., equal to $V_{SS}$) as a result of the $V_{cntl}$ node being raised up to $V_{CCA}$ voltage. (Block 52). A low value of $V_{BN}$ results in a high value of $DUMV_{BN}$, which, in turn, has the effect of setting the current sources in the dummy charge pump to large values. (Block 53).

The DumDn signal closes switch ($S_{dn}$) 58, thereby causing current source 59 to sink current from node $V_{cntl}$. A proportional reduction in voltage at this node occurs as a result. (Block 54). Decreasing the voltage at node $V_{cntl}$, causes bias voltage $V_{BN}$ to become larger. Increasing this bias voltage has the corresponding effect of increasing the frequency $F_{cntl\ vco}$ output from the voltage-controlled oscillator. Since $F_{fbk}$ is proportional to $F_{vco}$, it is clear that as $V_{BN}$ becomes larger the difference between $F_{fbk}$ and $F_{ref}$ becomes smaller. That is, the output frequency of the voltage-controlled oscillator $F_{fbk}$ approaches the reference frequency input into the phase/frequency detector.

The first charge pump is on at this time and also affects $V_{cntl}$. In an analog implementation, the operations in Blocks 52-54 may occur at the same time. Referring to Block 54, the Dummy charge pump is not always the only circuit that determines the decrease in voltage of $V_{cntl}$. For example, when $V_{BN}$ is zero, only DumCP drives $V_{cntl}$. However, while $V_{BN}$ increases charge pump 1 also drives $V_{cntl}$ based on the phase/frequency detector (e.g., reference numeral 3 in FIG. 1) output.

When the control unit detects that the difference between $F_{fbk}$ and $F_{ref}$ is zero or lies within a predetermined range $\Delta F$ (e.g., "20% relative to the reference frequency), the control unit de-asserts the EnDum. (Block 55). This results in de-activating the dummy nbias unit, thereby sending $DUMV_{BN}$ to zero. This, in turn, drives the output of the current sources of the dummy charge pump to zero. Also, to ensure that no leakage from the sink current source occurs, the control unit de-asserts the DumDn signal. This results in opening switch ($S_{dn}$) 58, thereby removing the sink current source from node $V_{cntl}$. (Block 56). At this time, the control unit may also de-assert the DisCP2 to thereby activate the third charge pump. The predetermined range $\Delta F$ is preferably selected to ensure that $F_{fbk}$ equals or is close enough to $F_{ref}$ so that the voltage-controlled oscillator and first and second charge pumps are biased sufficiently to cause the PLL to pass from startup mode to normal acquisition mode. When this occurs, the controller may revert to performing a passive monitoring function with respect to $F_{ref}$ and $F_{fbk}$.

Yank Mode Detection and Correction

In addition to or in lieu of startup mode detection and correction, at least one embodiment of the controller and method of the present invention detects and corrects a yank mode of operation of the phase-locked loop. A yank condition arises after startup and during a time when the output frequency of the voltage-controlled oscillator is larger than the reference frequency $F_{ref}$ by an unacceptable amount, and/or when either the feedback clock distribution or the feedback frequency divider fails to operate properly. When this occurs, bias voltage $V_{BN}$ and the currents from the first and third charge pumps are high enough to quickly change the PLL operating point. Corrective action should therefore be taken.

The "unacceptable amount" in the foregoing paragraph may be in the form of a limit on the feedback frequency set to a predetermined value. Alternatively, there may be no unacceptably high feedback frequency. In this latter case, if the feedback counter and network can operate, the PLL will acquire lock quickly. Since $V_{BN}$ and the charge pump currents are high, the PLL can drive itself towards lock.

A different situation may arise, however, when either the feedback counter or feedback network cannot operate at VCO frequency. Under these circumstances, the VCO frequency will be high and the feedback frequency smaller than $F_{vco}$ divided by N (feedback divider). When this occurs, the phase and frequency detector (PFD) will detect that the feedback frequency is too low and generate drive signals that to further increase the VCO frequency. The feedback counter/network will therefore operate even worse in a positive feedback way, and the PFD will drive the VCO frequency higher while the feedback frequency will become lower.

The "feedback clock distribution" may be explained as follows. PLLs are often used as clock generators. When used in this manner, their output signals may, for example, be distributed almost everywhere in a microprocessor. In some cases, the VCO output is distributed (such as in a feedback network). In this case, a feedback counter may be placed at one end of the distribution network. In other cases, the feedback divider may be placed immediately after the VCO and the feedback signal is distributed throughout the microprocessor system. Here, the feedback signal may be considered to operate at lower frequencies.

As an example, a yank condition may be considered to exist when the feedback frequency is less than 2% of the reference frequency and the PLL is not in startup mode. More specifically, startup has ended and some event occurs (e.g., power supply and/or reference signal frequency/phase not stable, etc.) during normal acquisition mode. Although the VCO output frequency is high at this time, the feedback signal has a very low frequency (or event does not toggle at all). This condition may be detected by control unit 30 as corresponding to a yank condition. Improper operation of the feedback divider may also trigger detection of a yank condition.

To illustrate the foregoing concepts in a non-limiting way, consider the case where the PLL reference frequency is 100 MHz, the VCO output frequency should be 2000 MHz, and the divider value is 20. At the end of startup mode, the VCO output frequency is 2400 MHz. At this point, the feedback divider fails to count correctly (e.g., is unable to operate at 2400 MHz) and the feedback frequency is 80 MHz (as if the divider value were 30). The PFD detects the feedback frequency as being slower than the reference frequency and drives the VCO higher, e.g., to 2500 MHz. With the frequency even higher, the counter operates in an even worse manner such that the feedback frequency is now 50 MHz (e.g., divider value=50). As this continues, the Yank condition is detected and corrected in the following manner.

To return the phase-locked loop to an acceptable functioning state (e.g., to normal acquisition mode), this embodiment of the method of the present invention may include the following blocks. In describing these blocks, it is noted that the dummy circuits may not be used to achieve PLL correction. Accordingly, the DumUp, DumDn, and EnDum signals remain unasserted.

Figure 6:
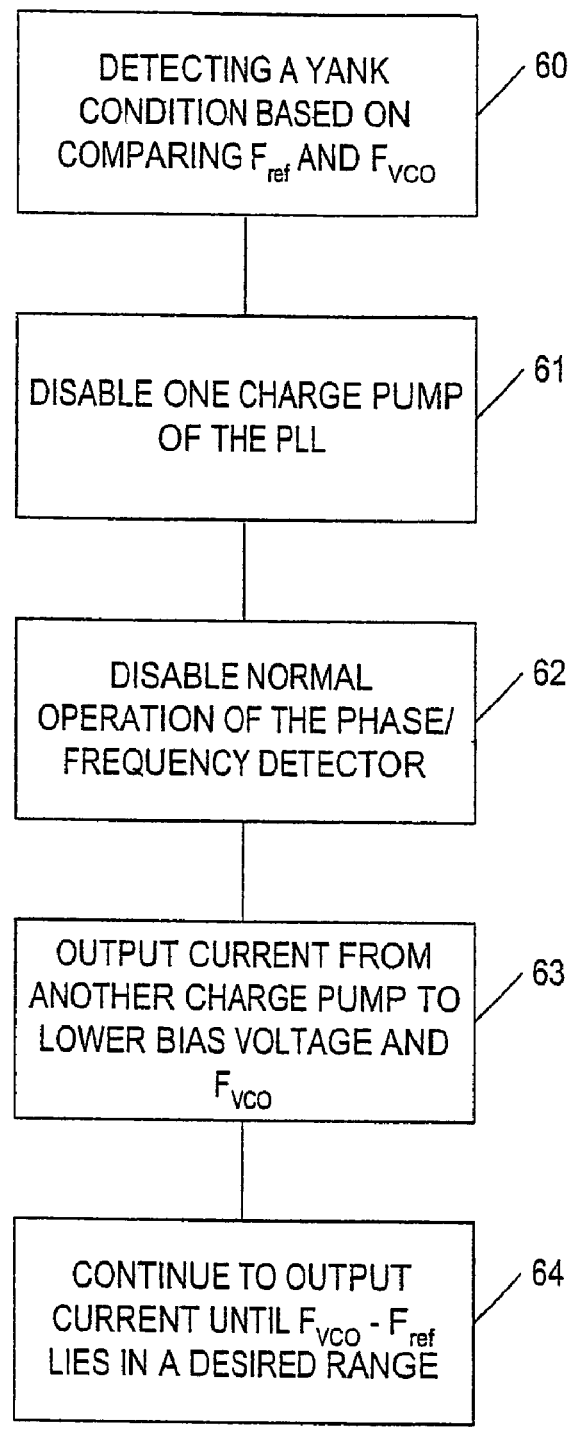
FIG. 6 is a diagram showing blocks included in a method for controlling the yank operation of a phase-locked loop in accordance with the embodiment of the present invention shown in FIG. 5, or in accordance with an alternative embodiment of the present invention.

Referring to FIG. 6, in a first block, the control unit detects the existence of a yank condition, for example, by determining that the feedback frequency $F_{fbk}$ varies relative to $F_{ref}$ by a predetermined amount. (Block 60). For example, the control unit may detect that $F_{fbk}$ is less than 2% or 20% of $F_{ref}$ and the PLL is not in the startup mode or the PLL disable mode. Alternatively, this condition may be detected by determining that the feedback clock distribution or the feedback frequency divider of the PLL is failing to operate properly.

In a second block, the control unit outputs the DisCP2 signal to disable second charge pump 2. (Block 61).

In a third block, the control unit outputs the ContUP signal to disable normal operation of the phase-frequency detector 1 and to force only the UP signal to be output from this detector. (Block 62). This causes current to be output from the first charge pump and the voltage at node $V_{cntl}$ to swing up. This, in turn, causes $V_{BN}$ to decrease along with the output frequency of the voltage-controlled oscillator $F_{vco}$. (Block 63). During this block, the PFD may continuously drive up the first charge pump.

In a fourth block, the UP signal continues to be asserted until the bias voltage $V_{BN}$ reaches a level where the difference between $F_{fbk}$ and $F_{ref}$ is zero or lies within a predetermined range (e.g., 20% relative to the reference frequency), as detected by the control unit. (Block 64) This predetermined range is preferably selected so that output frequency $F_{vco}$ is considered to lie within a normal operating range, i.e., one in which ensures that the PLL is operating within normal acquisition mode. At this point, the yank condition has been removed and the control unit de-asserts the ContUP and DisCP2 signals, thereby returning to normal operation.

Figure 7:
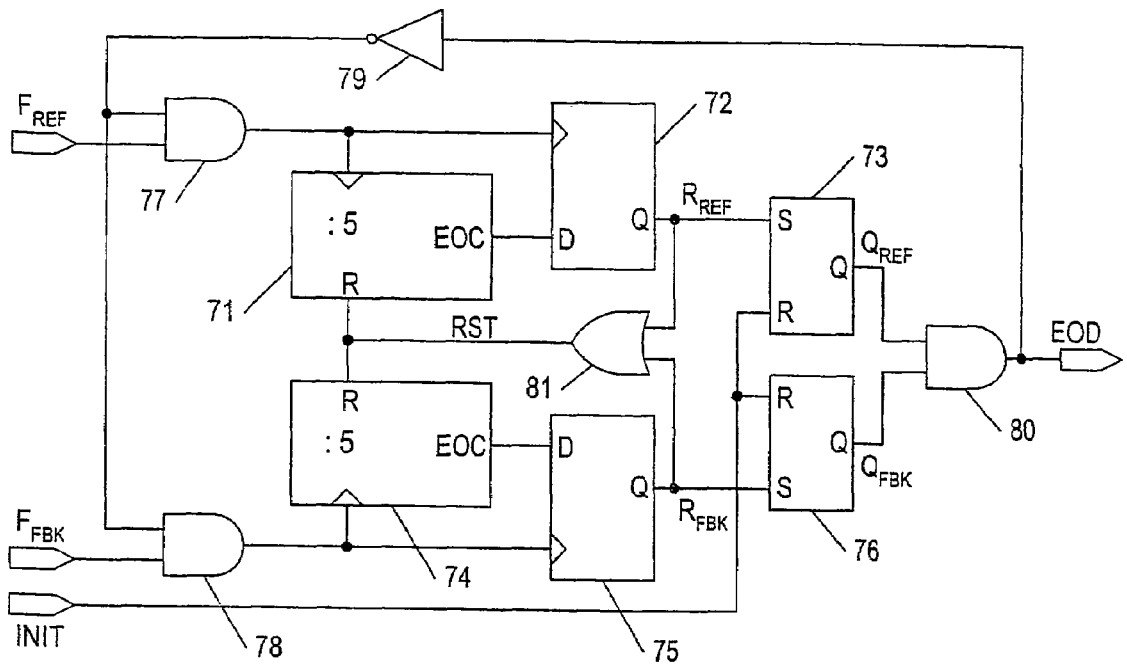
FIG. 7 is a diagram showing a frequency detector which may be included in one embodiment of the controller of the present invention.

FIG. 7 shows how the detector of the control unit may be constructed in accordance with one embodiment of the present invention. As shown, this detector may be a frequency cross detector which detects, for example, when the feedback frequency $F_{fbk}$ becomes greater than the reference frequency $F_{ref}$.

The frequency cross detector includes two parallel and symmetrical paths, one for receiving the reference frequency signal and the other for receiving the feedback frequency signal. The first path includes a divide-by-N counter 71 with an asynchronous reset (R), a D flip-flop 72, and an SR latch 73. The second path may be similarly constructed to include a divide-by-N counter 74 with an asynchronous reset (R), a D flip-flop 75, and an SR latch 76. The divide-by-N counters are preferably divide-by-5 counters, but those skilled in the art can appreciate that N may equal values other than 5.

The reference and feedback frequency signals are input along each path through respective logic gates 77 and 78. In this embodiment, the logic gates are shown to be AND gates but those skilled in the art can appreciate that a different arrangement of logic gates may be used. Each gate performs a logical AND operation between a respective one of the reference and feedback frequency signals and an inverted output of the cross detector. The output may be generated by gate 80, which performs a logical AND operation based on the outputs of the SR latches. Element 79 may be used to invert the output of this AND gate. To control resetting of the counters, the Q outputs of the D flip-flops, labeled $R_{ref}$ and $R_{fbk}$ respectively, may be combined in an OR gate 81. The output of this gate may then be simultaneously input into the asynchronous reset terminals of the counter circuits.

The INIT signal used to set the R values of the SR latches may correspond, for example, to the PLL disable signal. As stated, startup mode can occur only after PLL disable. Thus, the PLL disable signal may be used to initialize the frequency cross detector. Alternatively, the INIT signal may be a pulse indicating that a yank condition was detected and the circuit has entered yank mode. Again, the frequency cross detector may be initialized for proper operation.

In accordance with one illustrative embodiment, when the INIT signal is active HIGH the RS flip-flops 73 and 76 are reset. Once the startup or yank mode begins, the INIT signal may be de-asserted. The function of the INIT signal may therefore be to initialize the frequency cross detector. For example, at power up flip-flops 73 and 76 are activated so that $Q_{ref}=Q_{fbk}=1$. The end-of-detection (EOD) signal is asserted and the frequency cross detector will not operate (no clock signals to the counters 71, 74 and D flip-flops 72 and 75). When INIT is active, $Q_{ref}=Q_{fbk}=0$ and EOD=0.

FIG. 8(a)-(e) is a timing diagram showing the operation of the frequency cross detector.

The reference and feedback signals toggle at different frequencies. When the reference frequency $F_{ref}$ is higher than the frequency output from the voltage-controlled oscillator $F_{fbk}$ (e.g., such as at the beginning of the startup mode), counter 71 will end counting (EOC) first, $R_{ref}$ is asserted and both counters 71 and 74 are reset (EOC of 71 goes to zero, flip-flop 72 samples it and also goes to zero). $R_{ref}$ sets $Q_{ref}$ to logical one. This is reflected in the $R_{ref}$ and $R_{fbk}$ outputs of the D flip-flops. See FIGS. 8(a) and 8(b) respectively.

Figure 8:
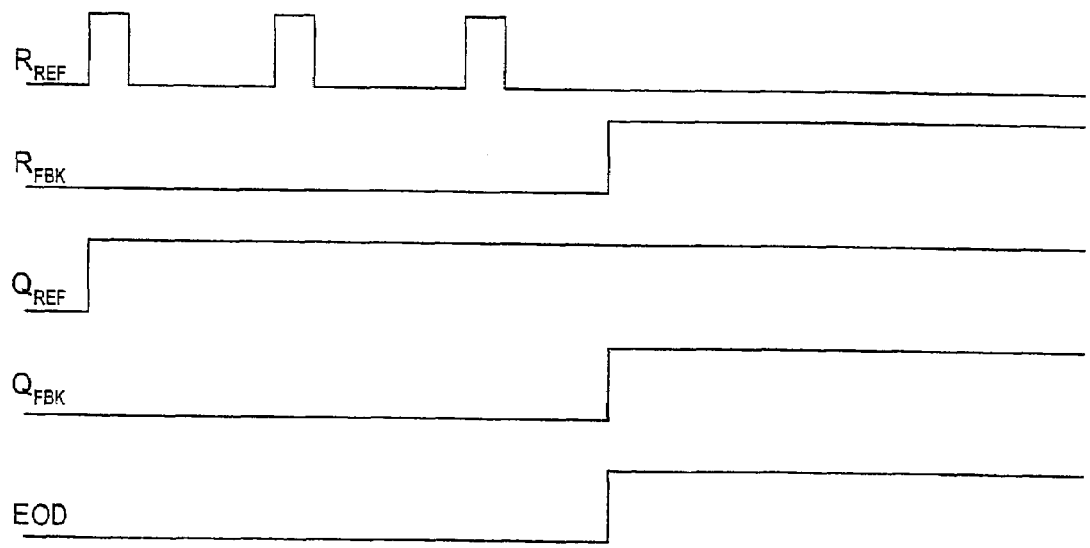
FIG. 8 is a diagram showing a timing diagram illustrating operation of the detector of FIG. 7.

More specifically, under these circumstances the reference path counter 71 is the first to assert the EOC (end-of-count) signal. More specifically, at startup the output of AND gate 80 is zero, which is inverted to a logical one by element 79. This logical one value and the reference signal pulses are input into gate 77, and the output of this gate drives divider 71 and D flip-flop 72. When the fifth clock period arrives, the EOC output of divider 71 is asserted and is sampled by the D flip-flop 72 in the next reference clock cycle, thus $R_{ref}$ goes to one. (See FIG. 8(a) representing three consecutive counting cycles in which the reference signal frequency is higher than the feedback clock frequency, so $R_{ref}$ is asserted three times in a raw implementation). Inputting a logical one into the S input of latch 73 causes the $Q_{ref}$ output to assume a logical one, which is reflected in FIG. 8(c).

When the feedback frequency signal becomes greater than the reference frequency signal, counter 74 will end counting first. As a result, the EOC of counter 74 goes to a logical value of one from its EOC terminal, D flip-flop 75 samples it, $R_{fbk}$ goes to one, both counters are reset, and $Q_{fbk}$ is set to logical one. Now, EOD goes to one. The values of $R_{fbik}$ under these circumstances is shown in FIG. 8(b). Inputting a logical one into the S input of latch 76 causes the $Q_{fbk}$ output to go high, and since both $Q_{ref}$ and $Q_{fbk}$ are high at this time gate 80 outputs a logical one end of dummy signal, thereby indicating that the feedback frequency signal has become equal to or greater than the reference frequency signal.

From the foregoing, it is clear that the reference path counter is the first to assert its EOC signal. This signal is sampled in the next clock cycle by the D flip-flop along this signal path, causing $R_{ref}$ to go high. The high value of $R_{ref}$ forces the reset signal high and both counters are reset and ready to begin a new frequency comparison cycle. $Q_{ref}$ is set as well. When the feedback frequency becomes higher than the reference frequency, $R_{fbk}$ is set first, $Q_{fbk}$ is set, and then the EOD signal.

The foregoing embodiments of the present invention may be modified in several ways. For example, while the controller has been described above as performing both startup and yank control functions in a self-biased PLL, those skilled in the art can appreciate that the controller may perform only one of these functions. Also, the frequency cross detector of FIG. 7 is just one example of how the control unit may detect the end of the startup process in the PLL. Those skilled in the art can appreciate that other detectors may alternatively be used. For example, the control unit may include a processor which executes a control program which detects the operational state of the PLL based on the reference and feedback frequency signals, and then generates the DumUp, DumDn, ContUP, DisCP2, and EnDum signals previously mentioned.

Figure 9:
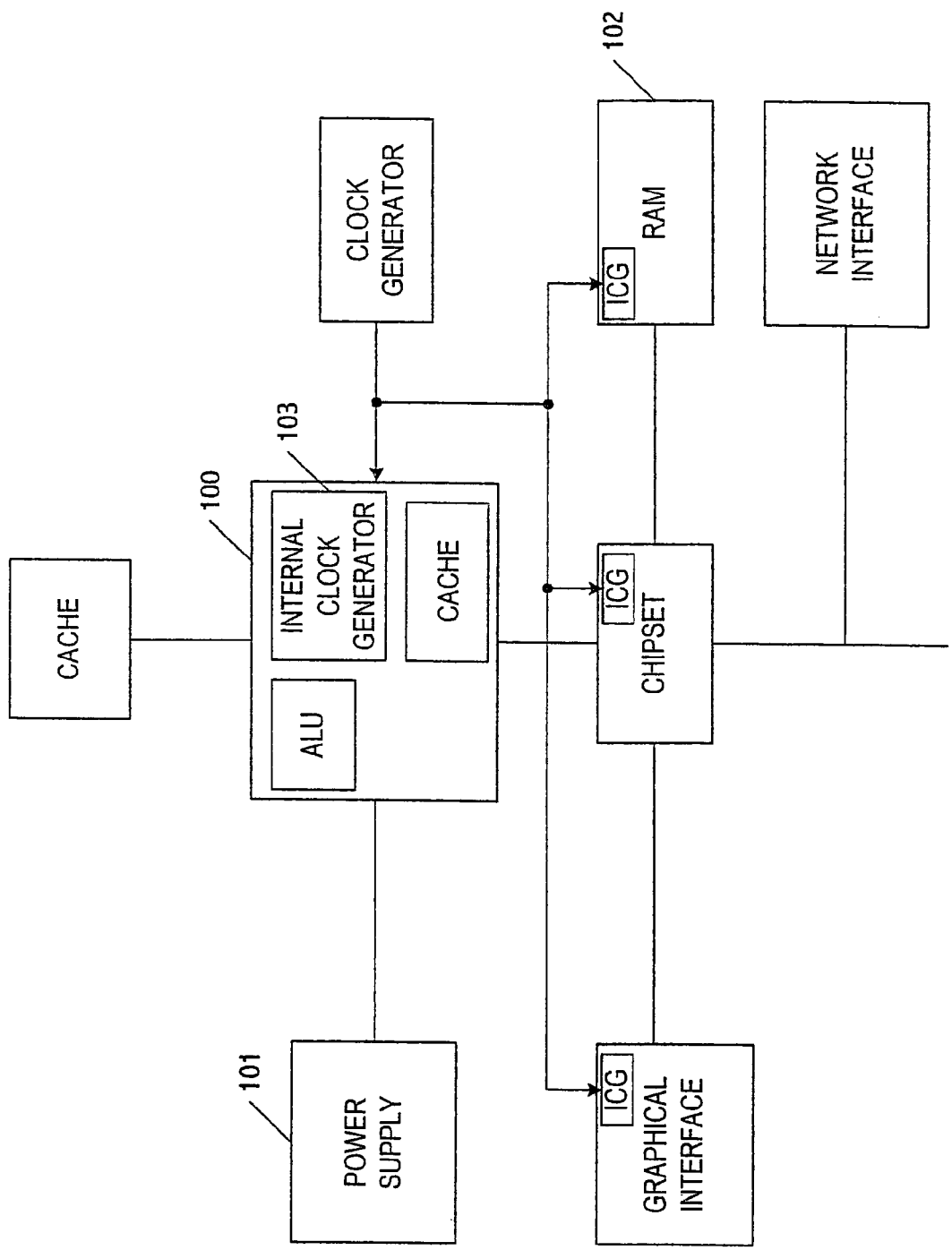
FIG. 9 is a diagram of a processing system which may include at least one embodiment of the controller of the present invention.

FIG. 9 is a diagram of processing system in accordance with one embodiment of the present invention. The processing system includes a processing chip 100, a power supply 101, a memory 102, and a clock generator 103 which includes a phase-locked loop in accordance with the present invention. The phase-locked loop may be a self-biased PLL if desired. The processing chip may be a microprocessor, ASIC, or some other processor. Also, while the clock generator is shown as residing off-chip, those skilled in the art can appreciate that the clock generator may also be formed on-chip (internal clock generator) in order to reduce space and thus promote miniaturization. Usually, at system level, one clock generator may be used to perform synchronization between or among components. Each component may have its own internal clock generator, shown as (ICG) in FIG. 9.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A circuit, comprising:
   a first charge pump coupled to a loop-filter capacitor;
   a second charge pump coupled to the loop-filter capacitor,
   a controller to control the second charge pump; and
   a bias signal generator to compare a first bias signal of the phase-locked loop to a reference signal and to generate a difference signal based on the comparison, the controller to control current between the second charge pump and the loop-filter capacitor based on the difference signal,
   wherein the second charge pump is to sink current from or to source current to the loop-filter capacitor to cause a phase-locked loop to convert from a first mode of operation to an acquisition mode of operation, and wherein the first mode of operation corresponds to a startup condition.

2. The circuit of claim 1, wherein the controller controls the second charge pump to sink current from or source current to the loop-filter capacitor until a difference between a reference frequency and a feedback frequency input into a phase/frequency detector of the phase-locked loop lies within a predetermined range corresponding to said acquisition mode of operation.

3. The circuit of claim 1, wherein an amount of current flowing between the second charge pump and the loop-filter capacitor is proportional to the difference signal.

4. The circuit of claim 1, wherein the controller controls the second charge pump to sink current from or source current to the loop-filter capacitor until the difference signal lies within a predetermined range.

5. The circuit of claim 4, wherein said predetermined range corresponds to said acquisition mode of operation of the phase-locked loop.

6. The circuit of claim 1, wherein the controller controls the second charge pump to sink current from or source current to the loop-filter capacitor based on detection of the startup condition, to thereby modify a level of the first bias signal of the phase-locked loop.

7. The circuit of claim 1, wherein the bias signal generator is to generate a second bias signal for the second charge pump based on the difference signal.

8. The circuit of claim 7, wherein the bias signal generator includes:
   a signal generator to generate the reference signal; and
   a summing amplifier to generate the difference signal between the reference signal and the first bias signal, the second bias signal to be generated based on the difference signal.

9. The circuit of claim 1, further comprising:
   a third charge pump; and
   a capacitor to smooth an output of the third charge pump before being input into an oscillator of the phase-locked loop, wherein a frequency of the oscillator is determined based on the first bias signal and the smoothed output of the third charge pump.

10. The circuit of claim 9, wherein the third charge pump is coupled between a phase/frequency detector of the phase-locked loop and the oscillator.

11. The circuit of claim 10, wherein the first bias signal biases the oscillator, the first charge pump, the second charge pump, and the third charge pump.

12. A method, comprising:
    controlling a node voltage of a loop-filter capacitor using a first charge pump; and
    controlling the node voltage of the loop-filter capacitor using a second charge pump;
    the first charge pump controlling the node voltage based on a comparison of a feedback signal and a first reference signal into a phase-locked loop, and the second charge pump controlling the node voltage to convert a phase-locked loop from a first mode of operation to an acquisition mode of operation, wherein the first mode of operation corresponds to a startup condition and wherein controlling the node voltage using the second charge pump includes:
    comparing a first bias signal of the phase-locked loon to a second reference signal;
    generating a difference signal based on the comparison; and
    controlling the node voltage based on the difference signal.

13. The method of claim 12, wherein the node voltage is controlled based on the difference signal until a difference between a frequency of the first reference signal and a frequency of the feedback signal lies within a predetermined range corresponding to said acquisition mode of operation.

14. The method of claim 12, wherein the second charge pump sinks current to or sources current from the node in an amount proportional to the difference signal.

15. The method of claim 12, wherein the node voltage is controlled based on the difference signal until the difference signal lies within a predetermined range.

16. The method of claim 15, wherein said predetermined range corresponds to said acquisition mode of operation.

17. The method of claim 12, wherein controlling the node voltage modifies a level of the first bias signal.

18. The method of claim 12, further comprising:
smoothing an output of a third charge pump before being input into an oscillator of the phase-locked loop, wherein a frequency of the oscillator is determined based on the first bias signal and the smoothed output of the third charge pump.

19. The method of claim 18, wherein the third charge pump is coupled between a phase/frequency detector of the phase-locked loop and the oscillator.

20. The method of claim 18, wherein the first bias signal biases the oscillator, the first charge pump, the second charge pump, and the third charge pump.

21. A system, comprising:
a phase-locked loop including a loop-filter capacitor;
a charge pump coupled to the loop-filter capacitor;
a controller to control the charge pump to sink current from or source current to the loop-filter capacitor to cause a phase-locked loop to convert from a first mode of operation to an acquisition mode of operation; and
a bias signal generator to compare a first bias signal of the phase-locked loop to a reference signal and to generate a difference signal based on the comparison, the controller to control current between the second charge pump and the loop-filter capacitor based on the difference signal.

22. The system of claim 21, wherein the controller controls the second charge pump to sink current from or source current to the loop-filter capacitor until a difference between a reference frequency and a feedback frequency input into a phase/frequency detector of the phase-locked loop lies within a predetermined range corresponding to said acquisition mode of operation.

23. The circuit of claim 21, wherein an amount of current flowing between the second charge pump and the loop-filter capacitor is proportional to the difference signal.

* * * * *